(12) United States Patent
Aloni et al.

(10) Patent No.: US 7,754,559 B2
(45) Date of Patent: Jul. 13, 2010

(54) METHOD FOR FABRICATING CAPACITOR STRUCTURES USING THE FIRST CONTACT METAL

(75) Inventors: Efraim Aloni, Migdal Haemek (IL); Yakov Roizin, Migdal Haemek (IL); Alexey Heiman, Migdal Haemek (IL); Michael Lisiansky, Migdal Haemek (IL); Amos Fenigstein, Migdal Haemek (IL); Myriam Buchbinder, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 12/051,114

(22) Filed: Mar. 19, 2008

(65) Prior Publication Data

US 2009/0239351 A1 Sep. 24, 2009

(51) Int. Cl.
*H01L 21/8238* (2006.01)
*H01L 21/20* (2006.01)

(52) U.S. Cl. .......... 438/211; 438/396; 257/E21.432; 257/E21.44; 257/E21.204

(58) Field of Classification Search .......... 438/396, 438/211; 257/382, 306, 316, E21.432, E21.44, 257/E21.204
See application file for complete search history.

(56) References Cited

U.S. PATENT DOCUMENTS

| | | | | |
|---|---|---|---|---|
| 5,488,244 A | * | 1/1996 | Quek et al. | 257/314 |
| 5,596,221 A | * | 1/1997 | Honda | 257/588 |
| 6,090,672 A | * | 7/2000 | Wanlass | 438/301 |
| 6,228,716 B1 | * | 5/2001 | Wanlass | 438/264 |
| 6,788,576 B2 | | 9/2004 | Roizin | |
| 6,794,720 B2 | * | 9/2004 | Yagishita et al. | 257/353 |
| 6,998,686 B2 | | 2/2006 | Chau et al. | |
| 2005/0221595 A1 | * | 10/2005 | Khan et al. | 438/593 |
| 2005/0248906 A1 | * | 11/2005 | Yeo et al. | 361/306.2 |
| 2006/0148181 A1 | * | 7/2006 | Chan et al. | 438/289 |
| 2006/0220141 A1 | * | 10/2006 | Besser | 257/371 |

OTHER PUBLICATIONS

Sung et al. "Novel Single-Poly EEPROM With Damascene Control-Gate Structure," IEEE Electron Device Letters, vol. 26, Issue 10, Oct. 2005, pp. 770-772.

* cited by examiner

*Primary Examiner*—David S Blum
(74) *Attorney, Agent, or Firm*—Bever, Hoffman & Harms, LLP; E. Eric Hoffman

(57) ABSTRACT

A capacitor structure is fabricated with only slight modifications to a conventional single-poly CMOS process. After front-end processing is completed, grooves are etched through the pre-metal dielectric layer to expose polysilicon structures, which may be salicided or non-salicided. A dielectric layer is formed over the exposed polysilicon structures. A conventional contact process module is then used to form contact openings through the pre-metal dielectric layer. The mask used to form the contact openings is then removed, and conventional contact metal deposition steps are performed, thereby simultaneously filling the contact openings and the grooves with the contact (electrode) metal stack. A planarization step removes the upper portion of the metal stack, thereby leaving metal contacts in the contact openings, and metal electrodes in the grooves. The metal electrodes may form, for example, transistor gates, EEPROM control gates or capacitor plates.

21 Claims, 19 Drawing Sheets

| WAFER # | EOT (Å) | V$_{BD}$ (Volts) | Q$_{BD}$ (C/cm$^2$) | Dielectric Layer 140 | Upper Electrode | Bottom Electrode |
|---|---|---|---|---|---|---|
| 1 | 224 | 25.2 | 2.7 | NO - 350Å / 60Å | W-plug, 8800 Å | POLY CoSi |
| 2 | 312 | 39.8 | 1.3 | ONO - 110Å / 300Å / 60Å | W-plug, 8800 Å | POLY CoSi |
| 3 | 280 | 34.2 | 0.28 | ON - 300Å / 110Å | W-plug, 8800 Å | POLY CoSi |
| 4 | 280 | 34.0 | 0.32 | ON - 300Å / 110Å | W-plug, 7000 Å | POLY CoSi |
| 5 | 265 | 36.4 | 0.235 | ONO - 60Å / 300Å / 60Å | W-plug, 8800 Å | POLY, no CoSi |
| 6 | 272 | 37.0 | 0.242 | ONO - 60Å / 300Å / 60Å | W-plug, 7000 Å | POLY, no CoSi |
| 7 | 231 | 24.7 | 0.395 | NO - 350Å / 60Å | W-plug, 8800 Å | Active Area |

METHOD FOR FABRICATING CAPACITOR STRUCTURES USING THE FIRST CONTACT METAL

FIELD OF THE INVENTION

The present invention relates to improved methods for fabricating a metal capacitor/gate electrode structure.

RELATED ART

Metal gate electrodes have been used in conventional CMOS transistor applications. For example, U.S. Pat. No. 6,998,686 to Chau describes a multi-layer material stack for CMOS application. However, Chau undesirably adds significant complexity to a conventional CMOS (single-polysilicon) process because three (non-standard) metal layers must be deposited prior to depositing the polysilicon layer.

Metal electrodes have also been used to implement the control gate of an EEPROM structure, as set forth by H. C. Sung et al., "Novel Single Poly EEPROM with Damascene Control Gate Structure", IEEE Electron Device Letter 2005, pp. 770. However, Sung et al. undesirably requires the addition of the following steps to a conventional CMOS process: a control gate mask formation, control gate etch, oxidation treatment, $Al_2O_3$ deposition, barrier metal (TiN) deposition, tungsten (W) fill, chemical-mechanical polishing (CMP) and post ALD anneal.

Accordingly, it would be desirable to have improved methods for fabricating metal capacitor/gate electrode structures, which are compatible with a conventional CMOS process.

SUMMARY

Accordingly the present invention provides improved methods for fabricating metal electrodes over dielectric materials, wherein such methods can be robustly integrated into a conventional CMOS process flow without changing the properties of the other devices fabricated on the same wafer. The metal electrodes fabricated in accordance with the present invention may be used as upper capacitor electrodes, wherein the lower capacitor electrodes are formed by (salicided or non-salicided) polysilicon layers or (salicided or non-salicided) silicon active areas. Capacitors fabricated in this manner exhibit a small layout area and a high capacitance. The metal electrodes fabricated in accordance with the present invention may alternately be used for other applications, such as forming gate electrodes of high-voltage silicon-on-insulator (SOI) transistors, or control gates of electrically erasable programmable read only memory (EEPROM) cells.

In a particular embodiment, a metal electrode structure is fabricated with only slight modifications to a conventional single-poly CMOS process. After front-end processing is completed using a conventional CMOS process steps, a non-conventional mask is formed over the pre-metal dielectric layer. This mask includes openings that define the locations where the metal electrode structures will subsequently be formed. A set of grooves are etched through the openings of the mask, wherein the grooves extend through the pre-metal dielectric layer to expose underlying polysilicon structures (which may be salicided or non-salicided). A dielectric layer is formed over the exposed polysilicon structures. The dielectric layer isolates these polysilicon structures from the subsequently formed metal electrode structures, thereby enabling the metal electrode structures to form transistor control gates or capacitor plates. The non-conventional mask is then stripped.

A conventional contact process module is then used to form contact openings through the pre-metal dielectric layer. These contact openings typically expose active (source/drain) regions and polysilicon regions. The contact mask used to form the contact openings is then removed, and conventional contact metal deposition steps are performed, thereby simultaneously filling the contact openings and the grooves with the contact metal stack. A planarization step removes the upper portion of the deposited metal stack, thereby leaving metal contact plugs in the contact openings, and metal electrodes in the grooves. Advantageously, the process of the present invention adds only one non-conventional mask (and one non-conventional dielectric layer) to a conventional CMOS process.

The present invention will be more fully understood in view of the following description and drawings.

DETAILED DESCRIPTION

Figure 1:
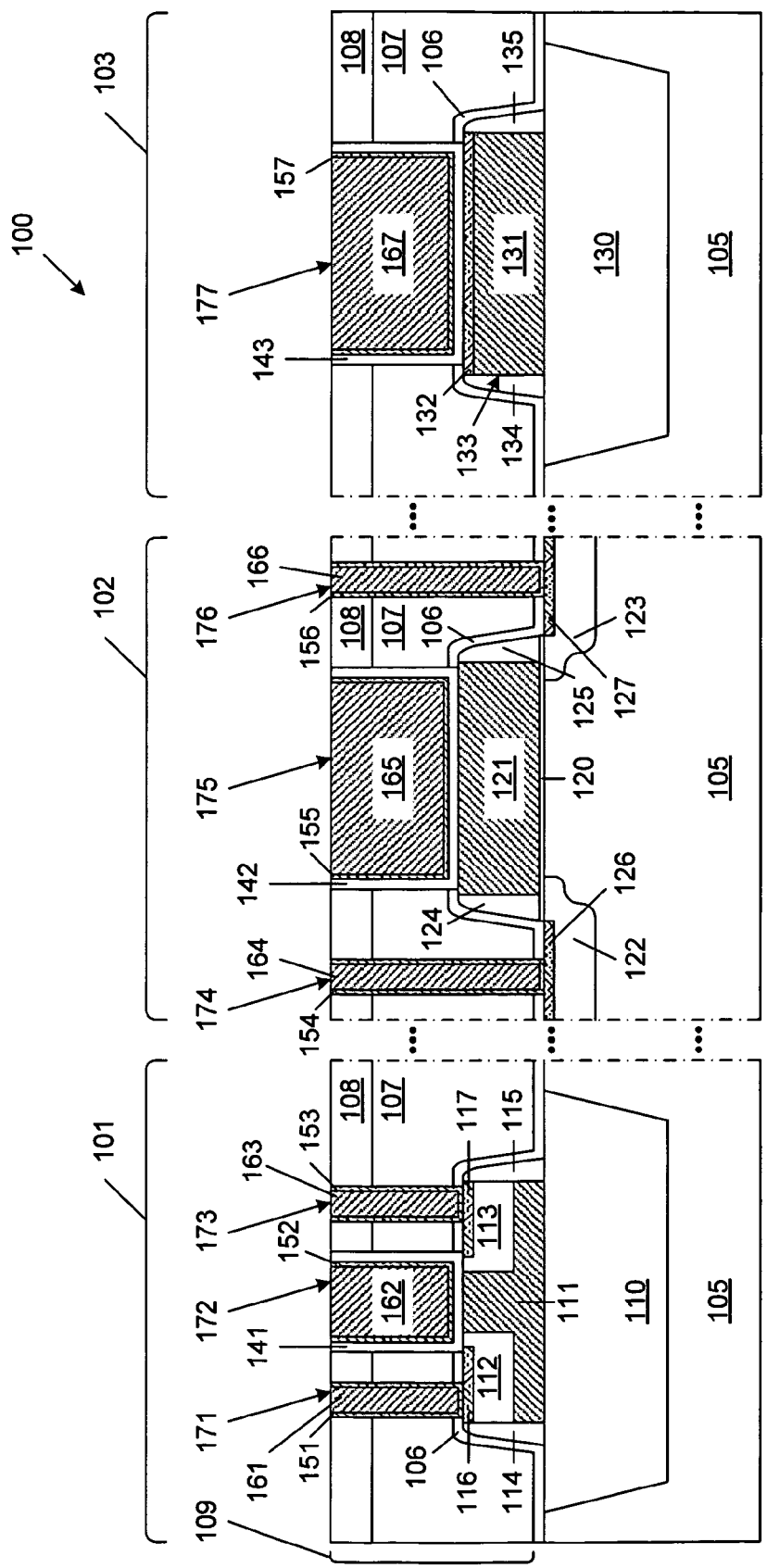
FIG. 1 is a cross-sectional view of a semiconductor structure that is fabricated by methods in accordance with one embodiment of the present invention.

FIG. 1 is a cross-sectional view of a semiconductor structure 100 in accordance with one embodiment of the present invention. Semiconductor structure 100 includes three semiconductor devices 101, 102 and 103, which may fabricated on the same semiconductor substrate 105. Semiconductor devices 101, 102 and 103 will now be briefly described.

Semiconductor device 101 is a high-voltage (e.g., 25 to 40 Volt) silicon-on-insulator (SOI) transistor, which includes shallow trench isolation (STI) region 110, polysilicon body region 111, source/drain regions 112-113, dielectric sidewall spacers 114-115, metal salicide source/drain contact regions 116-117, dielectric barrier layer 106, pre-metal dielectric structure 109 (which includes pre-metal dielectric layer 107 and pre-metal dielectric cap 108), gate dielectric layer 141, source/drain contact plug 171 (which includes composite metal barrier region 151 and metal contact structure 161), source/drain contact 173 (which includes composite metal barrier region 153 and metal contact structure 163, and stacked metal gate electrode 172 (which includes composite metal barrier region 152 and metal contact structure 162).

The polysilicon body region 111 of high-voltage transistor 101 is isolated from substrate 105 by shallow trench isolation (STI) region 110. Source/drain contact plugs 171 and 173 provide electrical connections to metal salicide source/drain regions 116 and 117, respectively (and thereby to the source/drain regions 112 and 113 of high-voltage transistor 101). Source/drain regions 112-113 are separated by a channel region within polysilicon body region 111. Stacked metal gate electrode 172 overlies this channel region (and is separated from this channel region by gate dielectric layer 141). Given the above-described structure of high-voltage SOI transistor 101, one of ordinary skill in the art would understand the general manner in which this device operates (e.g., the voltage applied to gate electrode 172 controls current flow between source/drain regions 112-113). As described in more detail below, stacked metal gate electrode 172 is formed at the same time as source/drain contact plugs 171 and 173, thereby enabling high-voltage transistor 101 to be fabricated with a process that is highly compatible with conventional CMOS processes.

Semiconductor device 102 is a single-poly electrically erasable and programmable read only memory (EEPROM) cell, which includes gate dielectric layer 120, polysilicon floating gate electrode 121, source/drain regions 122-123, dielectric sidewall spacers 124-125, metal salicide source/drain contact regions 126-127, contact barrier layer 106, pre-metal dielectric structure 109, inter-gate dielectric layer 142, source/drain contact plug 174 (which includes composite metal barrier region 154 and metal contact structure 164), source/drain contact plug 176 (which includes composite metal barrier region 156 and metal contact structure 166), and stacked metal control gate electrode 175 (which includes composite metal barrier region 155 and metal contact structure 165). Given the above-described structure of single-poly EEPROM cell 102, one of ordinary skill in the art would understand the general manner in which this device operates (e.g., the charge stored by the polysilicon floating gate 121 in response to program/erase operations determines the data stored by the EEPROM cell). As described in more detail below, stacked metal control gate electrode 175 is formed at the same time as source/drain contact plugs 174 and 176, thereby enabling EEPROM cell 102 to be fabricated with a process that is highly compatible with conventional CMOS processes.

Semiconductor device 103 is a high-voltage capacitor, which includes shallow trench isolation region 130, lower capacitor electrode 133 (which includes polysilicon region 131 and metal salicide region 132), dielectric sidewall spacers 134-135, contact barrier layer 106, pre-metal dielectric structure 109, capacitor dielectric layer 143 and stacked metal upper capacitor electrode 177 (which includes composite metal barrier region 157 and metal contact structure 167). Given the above-described structure of high-voltage capacitor 103, one of ordinary skill in the art would understand the general manner in which this device operates. As described in more detail below, stacked metal upper capacitor electrode 177 is formed at the same time as other contact plugs, thereby enabling high voltage capacitor 103 to be fabricated with a process that is highly compatible with conventional CMOS processes.

FIGS. 2A-2H are cross-sectional views illustrating semiconductor structure 100 during various stages of fabrication, in accordance with one embodiment of the present invention.

Figure 2A:
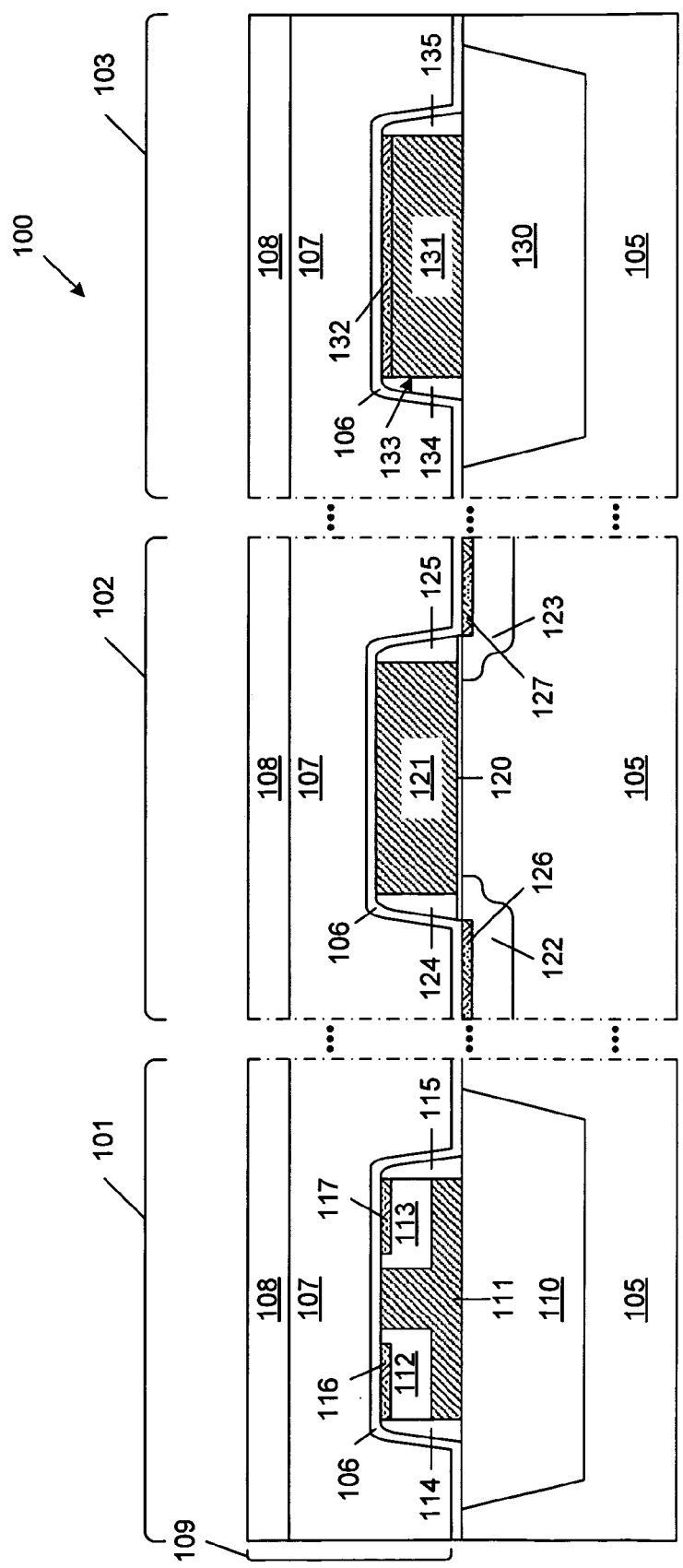
FIGS. 2A-2H are cross-sectional views of the semiconductor structure of FIG. 1, during various stages of fabrication.

FIG. 2A is a cross-sectional diagram illustrating semiconductor devices 101-103 after conventional front-end CMOS processing has been completed. Note that salicidation (e.g., the formation of salicide regions 116-117, 126-127 and 132), deposition of the contact barrier dielectric 106, deposition and planarization of the pre-metal dielectric layer 107 and formation of the pre-metal dielectric cap 108, are all completed during conventional CMOS front-end processing. In the described embodiments, salicide regions 116-117, 126-127 and 132 are cobalt salicide ($CoSi_2$), however, different types of metal salicide can be used in other embodiments. Contact barrier dielectric layer 106 is typically silicon nitride (SiN), although other dielectric materials can be used in other embodiments. Pre-metal dielectric layer 107 can be, for example, boron phosphorus silica glass (BPSG) or phosphorus silica glass (PSG). Pre-metal dielectric cap layer 108 can be, for example, silicon dioxide deposited from tetra-ethoxy silane (TEOS). Pre-metal dielectric layer 107 can also include TEOS silicon dioxide. The pre-metal dielectric layer 107 is typically planarized using a chemical-mechanical polishing (CMP) process (prior to forming pre-metal dielectric cap 108).

In a conventional CMOS process, after the front-end processing is complete (FIG. 2A), a contact process module is typically used to form metal contacts (plugs), which extend through the pre-metal dielectric structure 109 and contact polysilicon/salicide regions and active regions formed during the front-end processing. The metal contact plugs also provide connections to the upper metal lines that are formed during conventional back-end processing.

However, in accordance with the present invention, the contact process module is not implemented immediately after completing the front-end processing. Instead, processing proceeds as follows.

Figure 2B:
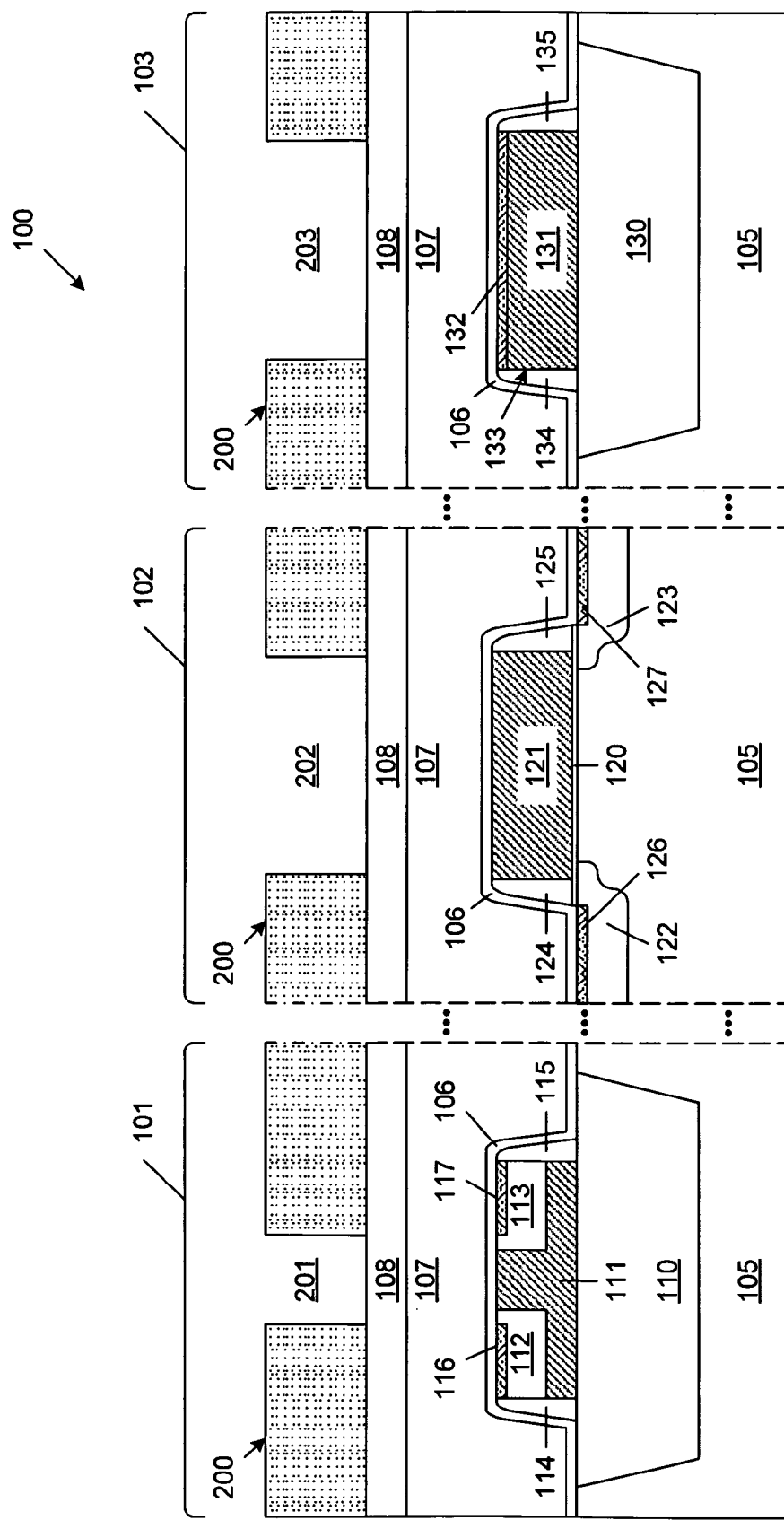

As illustrated in FIG. 2B, a photoresist mask 200 is formed over the upper surface of pre-metal dielectric structure 109. Photoresist mask 200 includes openings 201, 202, and 203, which define the locations where stacked metal gates/electrodes are to be subsequently formed using the contact process module in accordance with the present invention. More specifically, openings 201, 202 and 203 define the locations of subsequently formed stacked metal gate electrode 172, stacked metal control gate electrode 175 and stacked metal upper capacitor electrode 177, respectively. Note that photoresist mask 200 represents an additional (non-conventional) mask with respect to a conventional CMOS process.

Figure 2C:
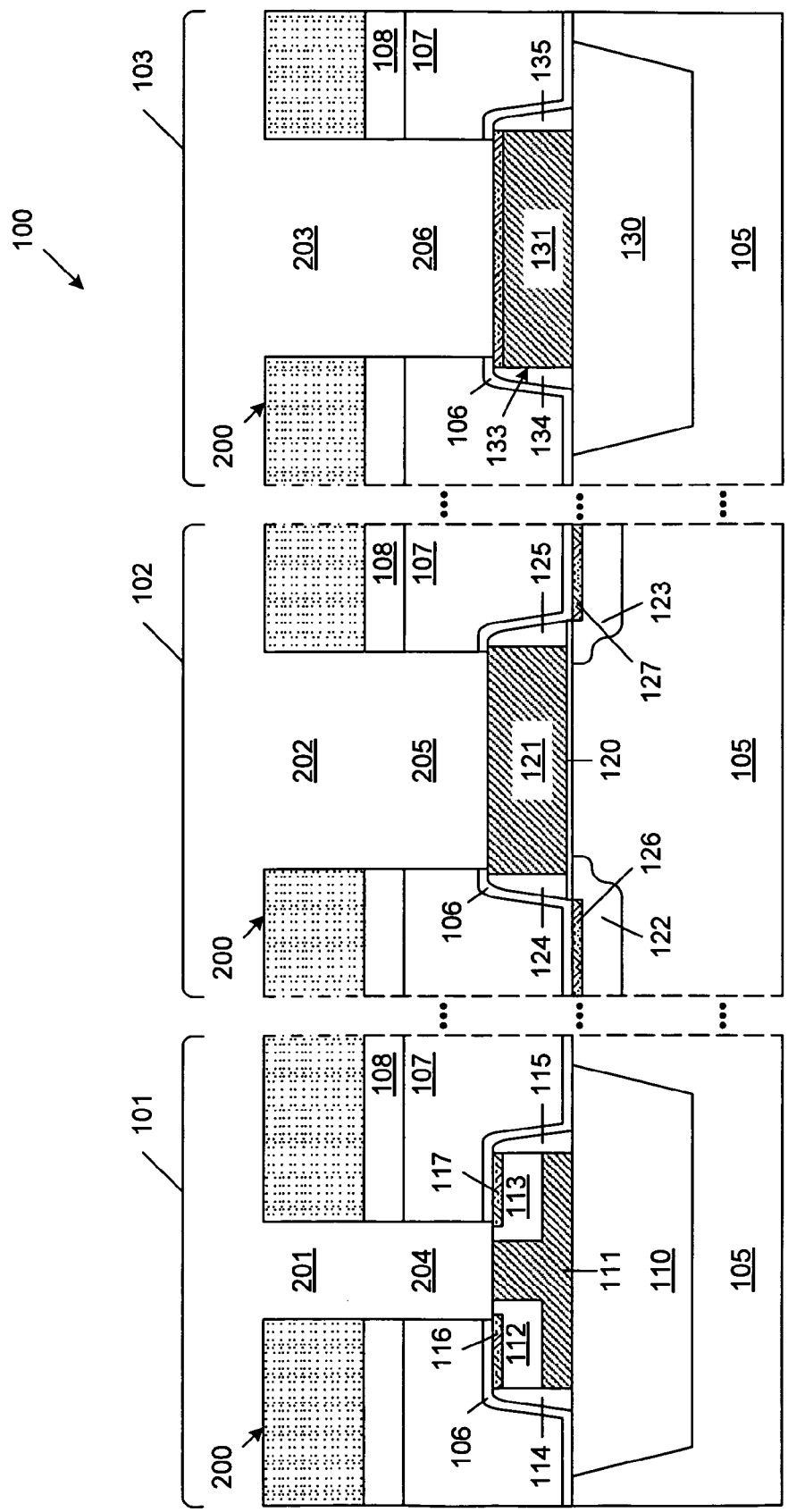

As illustrated in FIG. 2C, an etch is performed through the openings 201-203 of photo resist mask 200, thereby forming grooves 204-206, respectively. This etch is performed such that grooves 204-206 extend through pre-metal dielectric cap 108, pre-metal dielectric layer 107, and contact barrier dielectric layer 106. The etch process can be dry, wet, or a combination of dry and wet etches. It is important to note that the underlying regions exposed by this etch process can be either non-salicided polysilicon or salicided polysilicon. For example, non-salicided polysilicon body region 111 is exposed through groove 204, non-salicided polysilicon floating gate electrode 121 is exposed through groove 205, and metal salicide region 132 is exposed through groove 206. In an alternate embodiment, the upper surface of polysilicon floating gate electrode 121 may be salicided during the front-end process. Note that the etch of FIG. 2C represents an additional etch with respect to a conventional CMOS process.

In accordance with one embodiment, a one-step dry etch process is implemented to form grooves 204-206, wherein this one-step dry etch exhibits stop points on either cobalt salicide or polysilicon. For example, a fixed-time plasma etch may be performed at a power of about 1.1 kW and a low pressure of about 150 mTorr, with fluorinated carbon gases. This etch process has an oxide-to-cobalt salicide selectivity greater than 5. Using this one-step dry etch, grooves with a stop point on cobalt salicide are characterized by excellent etch uniformity over the entire surface of a wafer, accompanied with minimum consumption of cobalt salicide. This one-step dry etch provides a sharp front of the groove, which is critical for production of scaled-down devices. Moreover, this one-step dry etch does not result in significant differences in the shape and features of grooves having bottoms on cobalt salicide, polysilicon/STI regions or active areas.

Figure 2D:
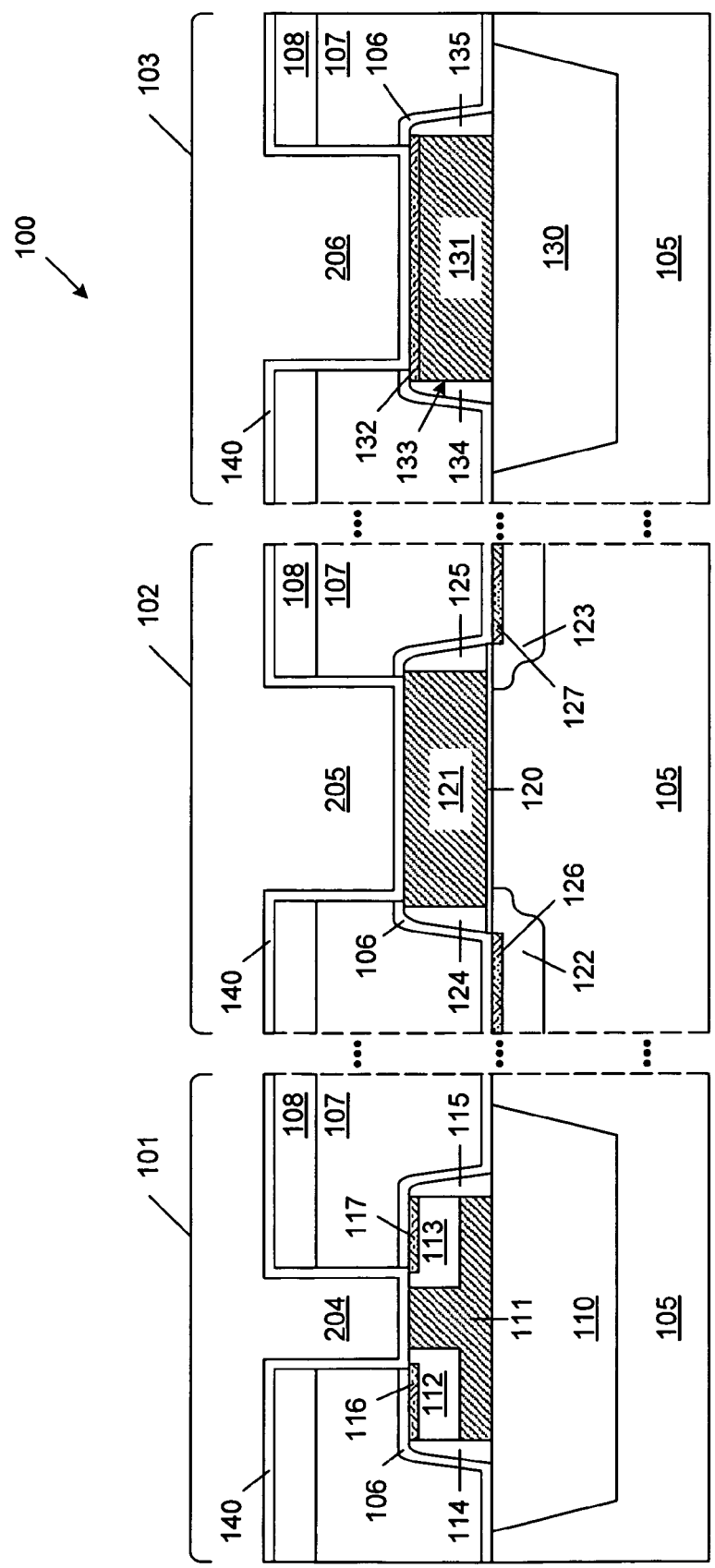

As illustrated in FIG. 2D, photo resist mask 200 is then stripped, and a dielectric layer 140 is deposited over the resulting structure. In accordance with one embodiment, dielectric layer 140 may be silicon oxide, silicon nitride, or a high-dielectric material, such as alumina. Alternately, dielectric layer 140 may be a dielectric stack that includes any combination of these dielectric materials. The properties of dielectric layer 140 are selected to correspond with the desired properties of the gate/inter-gate dielectric layer formed by this layer 140. That is, the properties of dielectric layer 140 are selected to correspond with the desired properties of transistor gate dielectric layer 141, inter-gate dielectric layer 142, and/or capacitor dielectric layer 143. The formation of dielectric layer 140 represents an additional step with respect to a conventional CMOS process.

Figure 2E:
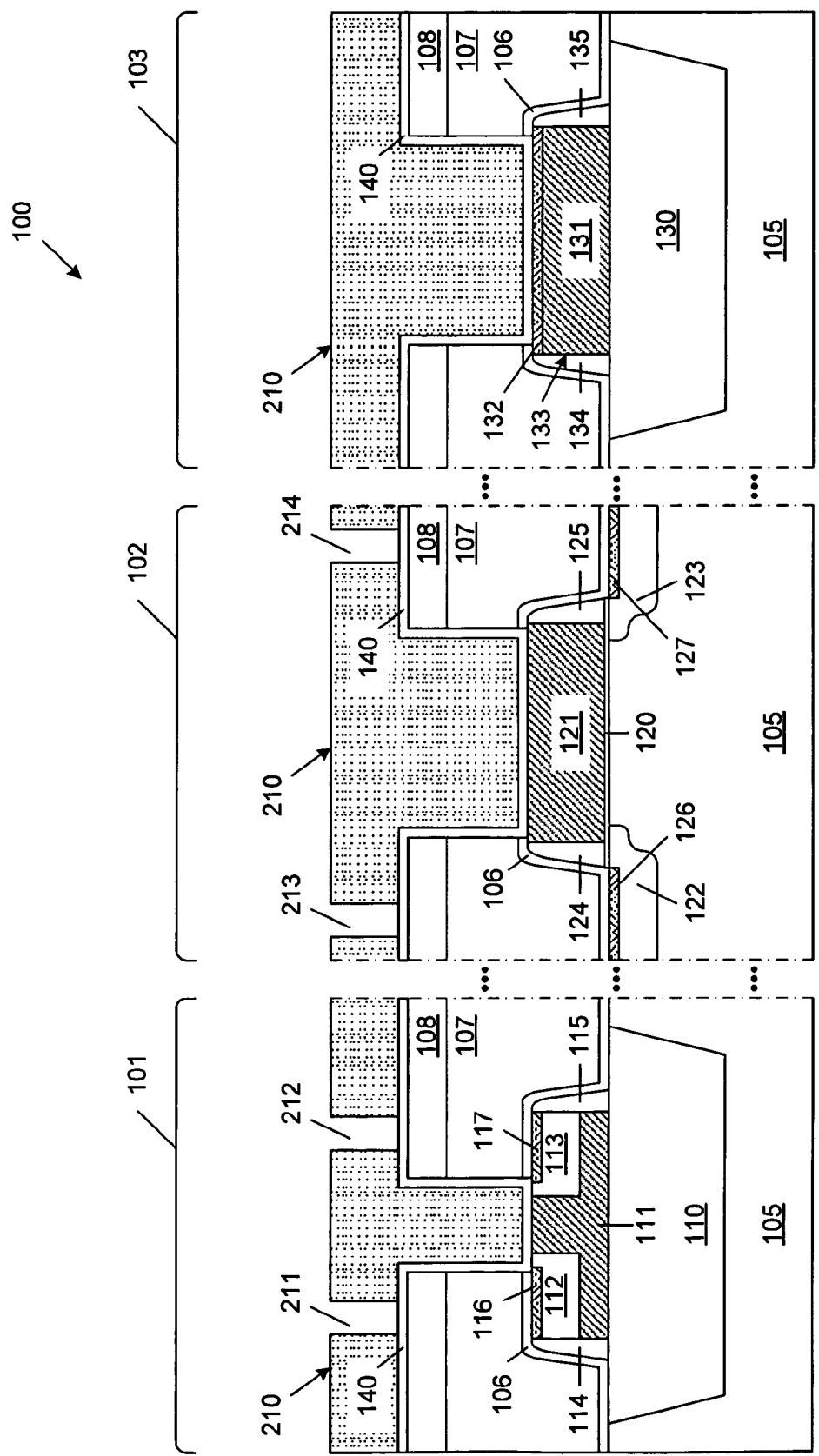

As illustrated in FIG. 2E, photoresist mask 210 is formed over dielectric layer 140. This photo resist mask 210 is identical to the photo resist mask used to form the standard metal contact openings in a conventional CMOS process. Photo resist mask 210 includes openings 211, 212, 213 and 214, which define the locations where the respective source/drain contact plugs 171, 173, 174 and 176 will be formed. Note that photo resist mask 210 may also include another opening (not shown), which defines the location where a contact to lower capacitor electrode 133 will be formed.

Figure 2F:
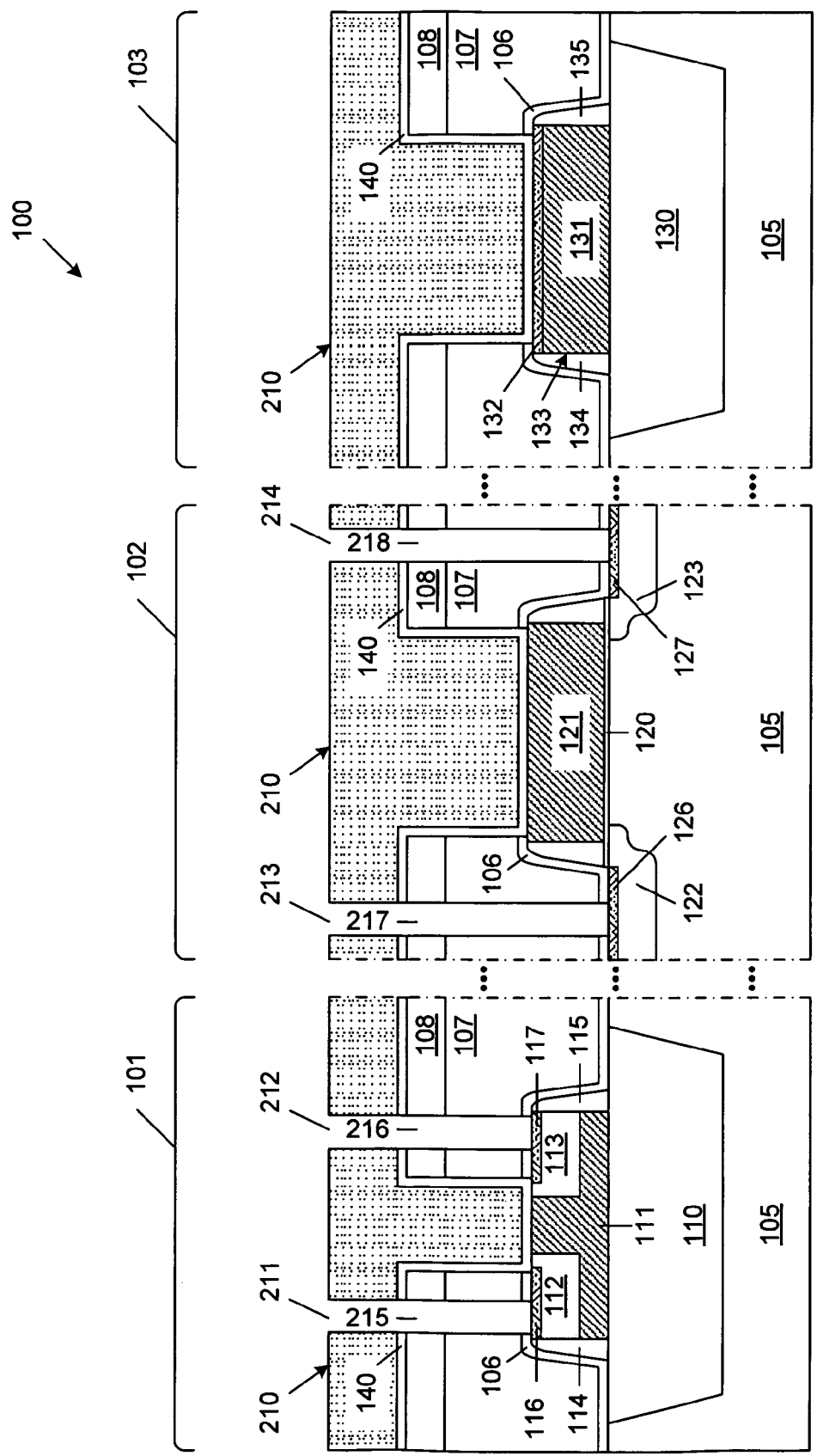

As illustrated in FIG. 2F, an etch is performed through the openings 211-214 of photo resist mask 210 thereby forming openings 215-218, respectively. This etch is performed such that openings 215-218 extend through dielectric layer 140, pre-metal dielectric cap 108, pre-metal dielectric layer 107, and contact barrier dielectric layer 106. The etch process can be dry, wet, or a combination of dry and wet etches. It is important to note that the layers exposed by this etch process can be either salicided polysilicon (as illustrated) or non-salicided polysilicon. The initial portion of the etch of FIG. 2F, wherein dielectric layer 140 is etched through openings 211-214, represents an additional etch step with respect to a conventional CMOS process. However, the remaining portions of the etch of FIG. 2F are present in a conventional CMOS process.

Figure 2G:
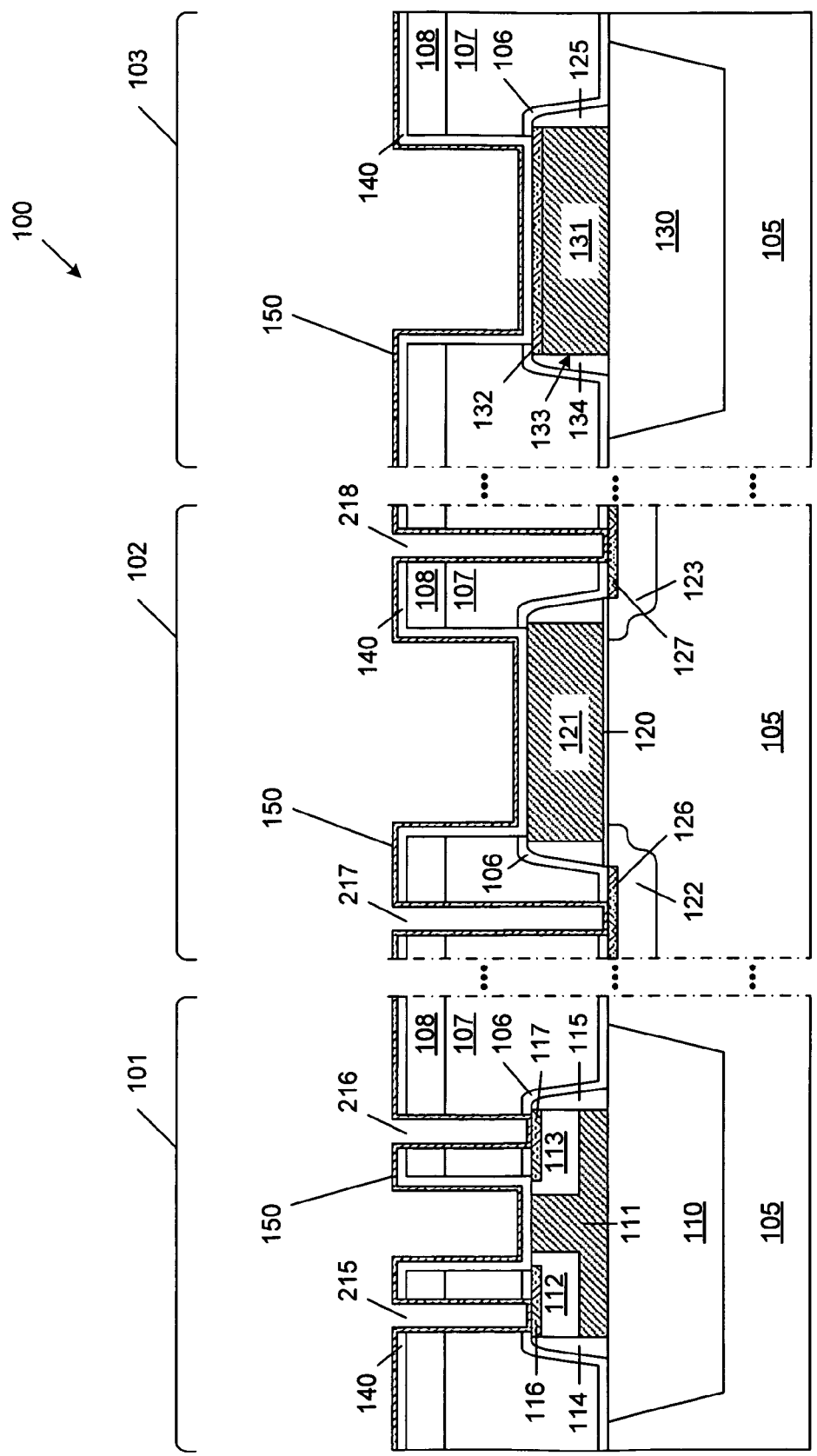

As illustrated in FIG. 2G, photoresist mask 210 is stripped, and composite metal barrier layer 150 is formed over the resulting structure. Composite metal barrier layer 150 is a conventional layer that prevents subsequently deposited metal from spiking into underlying silicon regions. In the described embodiment, composite metal barrier layer 150 includes titanium and titanium nitride (Ti/TiN). The composition of metal barrier layer 150 is selected in view of the identity of the subsequently deposited metal contact material. For example, composite metal barrier layer 150 is selected to be titanium/titanium nitride when the subsequently deposited metal contact material is tungsten (W).

However, composite metal barrier layer 150 may have a different composition (e.g., tantalum/tantalum nitride (Ta/TaN)), when other metal contact materials are used (e.g., aluminum or copper). The selection of appropriate metal barrier materials is well known to those of ordinary skill in the art. The formation of composite metal barrier layer 150 is present in a conventional CMOS process.

Figure 2H:
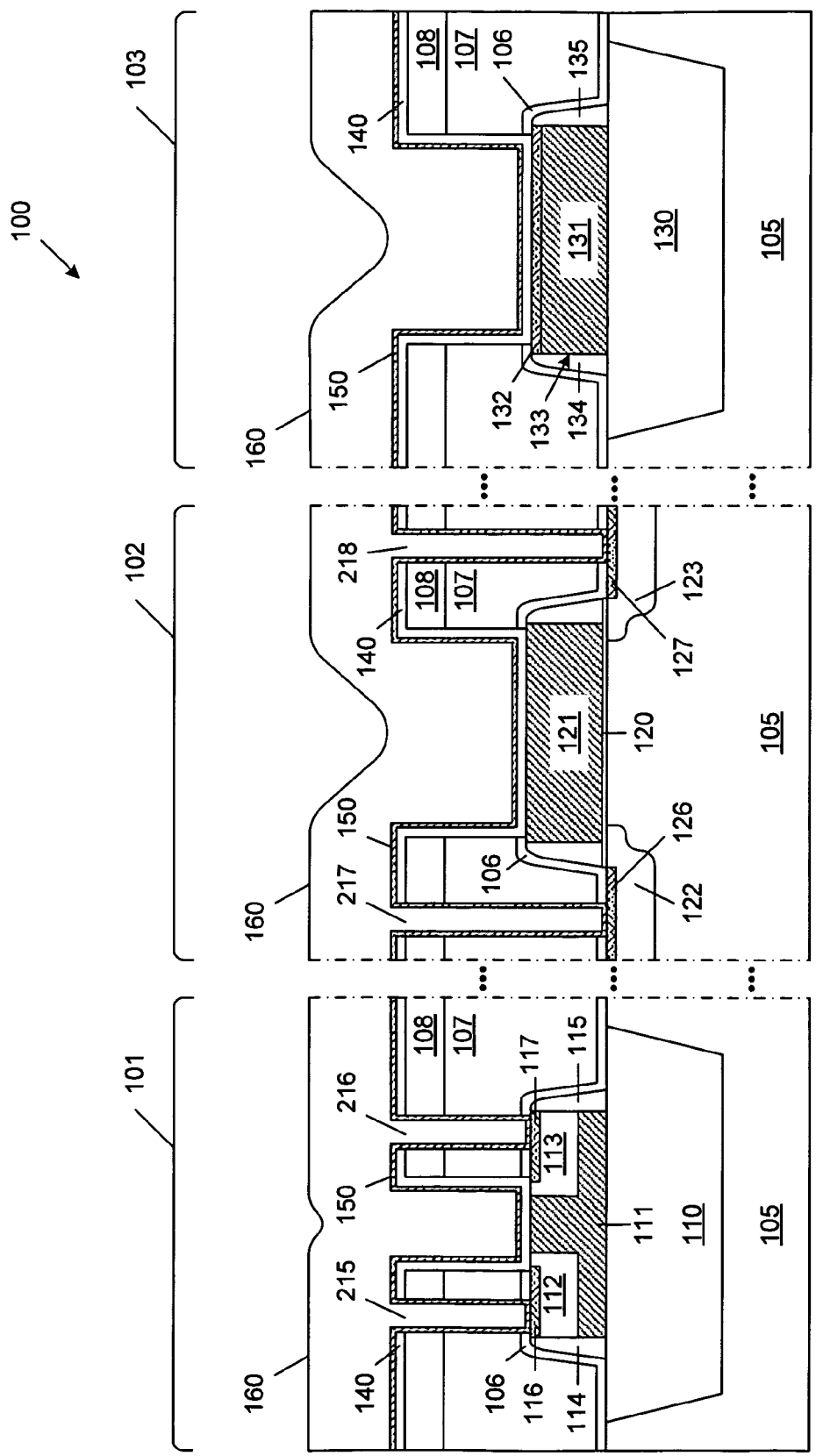

As illustrated in FIG. 2H a layer of metal contact material 160 is formed over the composite metal barrier layer 150. In the described embodiment, the metal contact layer 160 is tungsten, which is fabricated by chemical vapor deposition (CVD). The metal contact layer 160 is deposited such that the previously formed openings 204-206 and 215-218 are filled. The deposition of metal contact layer 160 is present in a conventional CMOS process.

Following the chemical vapor deposition of metal contact layer 160, a chemical mechanical polishing (CMP) process is performed. This CMP process is stopped after exposing the upper surface of pre-metal dielectric layer 109. As a result, the portions of composite metal barrier layer 150 and metal contact layer 160 located directly over the upper surfaces of pre-metal dielectric structure 109 are removed. At the end of this CMP process, the remaining portions of composite metal barrier layer 150 form composite metal barrier regions 151-157, and the remaining portions of metal contact layer 160 form metal contact structures 161-167, as illustrated in FIG. 1. Note that the stacked metal electrode structures 172, 175 and 177 formed in accordance with the present invention are wider than the metal contact plugs 171, 173, 174 and 176. As a result, the wider metal electrode structures 172, 175 and 177 may exhibit 'dishing', wherein the upper surfaces of these metal electrode regions 172, 175 and 177 are slightly lower than the upper surfaces of the metal contact plugs 171, 173, 174 and 176. However, with appropriate layout design rules, this 'dishing' phenomenon will not interfere with the subsequent back-end processing steps. From the structure illustrated in FIG. 1, standard back-end processing steps are performed to complete fabrication of the semiconductor structure 100.

Different dielectric materials can be used to implement dielectric layer 140 (FIG. 2D), in accordance with various embodiments of the present invention. For example, dielectric layer 140 may be silicon oxide, silicon nitride and their combinations (e.g., NO, ON, ONO). Various combinations were tested to demonstrate the feasibility of producing capacitors having a bottom electrode formed of either polysilicon (salicided or non-salicided) or an active area, and an upper electrode formed of a tungsten plug having a titanium/titanium nitride composite. In general, a capacitor having a bottom electrode formed of an active area can be formed in a manner similar to that described above for high-voltage capacitor structure 103. However, the lower capacitor electrode 131 is replaced by a (salicided or non-salicided) conductively doped silicon region formed in the substrate 105. (Note that lower capacitor electrode 131, dielectric sidewall spacers 134-135, and shallow trench isolation region 130 are eliminated in this capacitor structure).

Figures 3, 4:
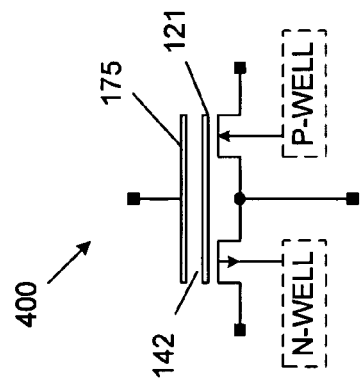
FIG. 3 is a table that summarizes the characteristics of seven different capacitor structures fabricated in accordance with methods of the present invention.
FIG. 4 is a circuit diagram of a complementary non-volatile memory cell having a control gate fabricated in accordance with one embodiment of the present invention.

FIG. 3 is a table 300 that summarizes the characteristics of capacitor structures fabricated on seven different wafers. Within table 300, EOT is the effective oxide thickness of the dielectric layer 140 in Angstroms, $V_{BD}$ is an averaged breakdown voltage of the resulting capacitor structures (over 10 units), and $Q_{BD}$ is an averaged charge to breakdown (in Coulombs/cm$^2$) measured at a 0.01 Amps/cm$^2$ current density through the capacitor structure (and averaged over 10 units). As illustrated by table 300, all of the proposed capacitor structures show high performance and the ability to work at high voltages. No built-in charge was found in the tested capacitor structures.

In a particular embodiment of the present invention, the structure of semiconductor device 102 can be used to implement a complementary non-volatile memory cell whose basic structure is described in U.S. Pat. No. 6,788,576 to Roizin. FIG. 4 is a circuit diagram of such a complementary non-volatile memory cell 400, which includes a shared polysilicon floating gate having the structure of polysilicon floating gate 121 (FIG. 1), an inter-gate dielectric layer having the structure of inter-gate dielectric region 142, and a shared control gate having the structure of stacked metal control gate 175.

Figure 5:
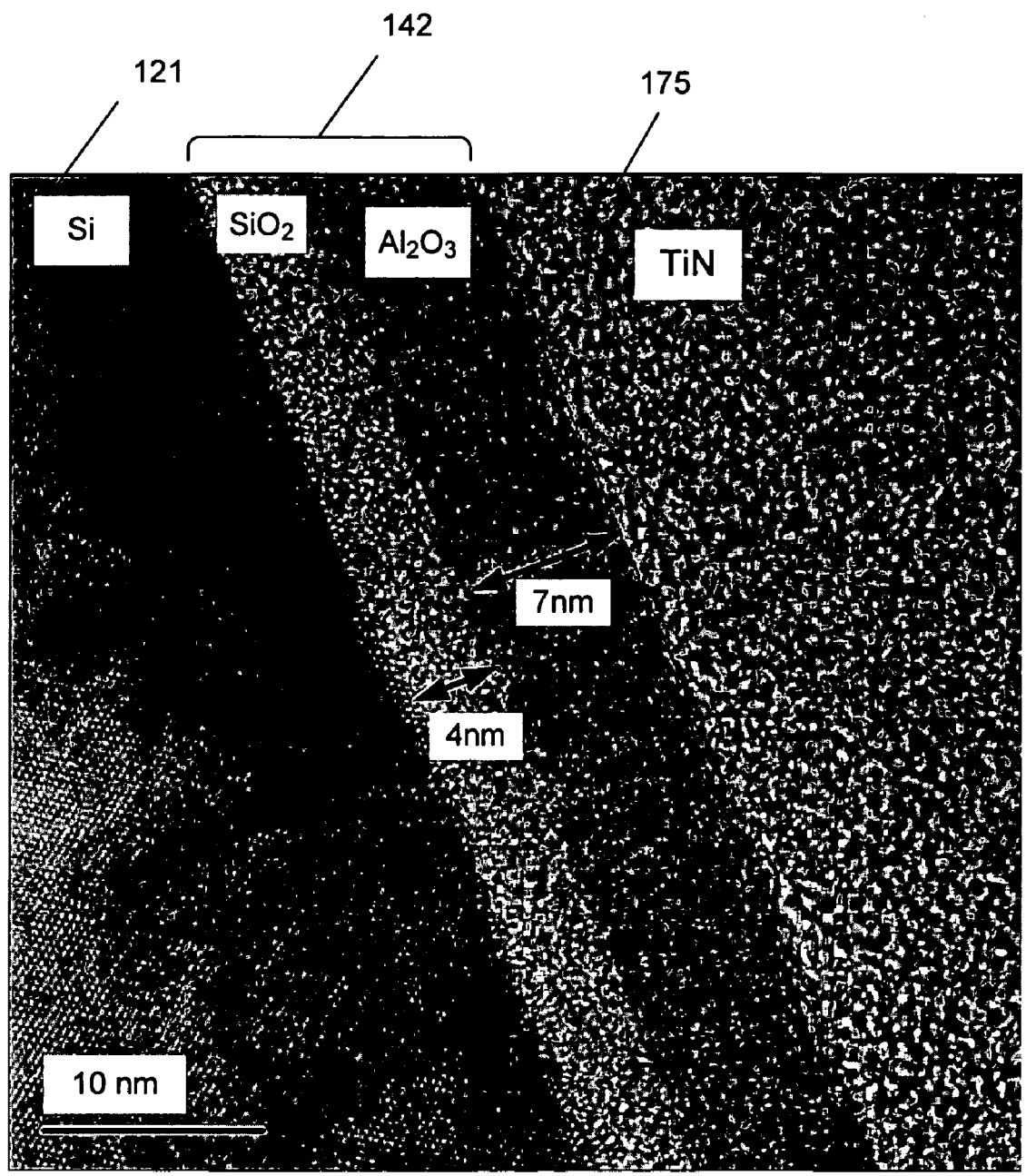
FIG. 5 is a High Resolution TEM image illustrating a dielectric structure fabricated in accordance with one embodiment of the present invention.

FIG. 5 is a High Resolution TEM image 500 illustrating a dielectric region 142 in accordance with one embodiment of the present invention. In this embodiment, dielectric region 142 is an alumina-silicon dioxide (A-O) stack. Stacked metal control gate 175 (Ti/TiN under W, wherein W is not shown) provides a higher barrier for electron injection than a polysilicon control gate (pinning effect), and is therefore preferable in device operation (i.e., parasitic injection from the metal control gate 175 is suppressed during erase operations).

Post deposition annealing (PDA) reduces the EOT of the alumina-silicon dioxide stack 142, and also improves the electrical performance of the alumina-silicon dioxide stack 142. The electrical performance of the alumina-silicon dioxide stack 142 of FIG. 5 advantageously exceeds the analogous parameters of silicon dioxide with the same physical thickness.

Figure 6:
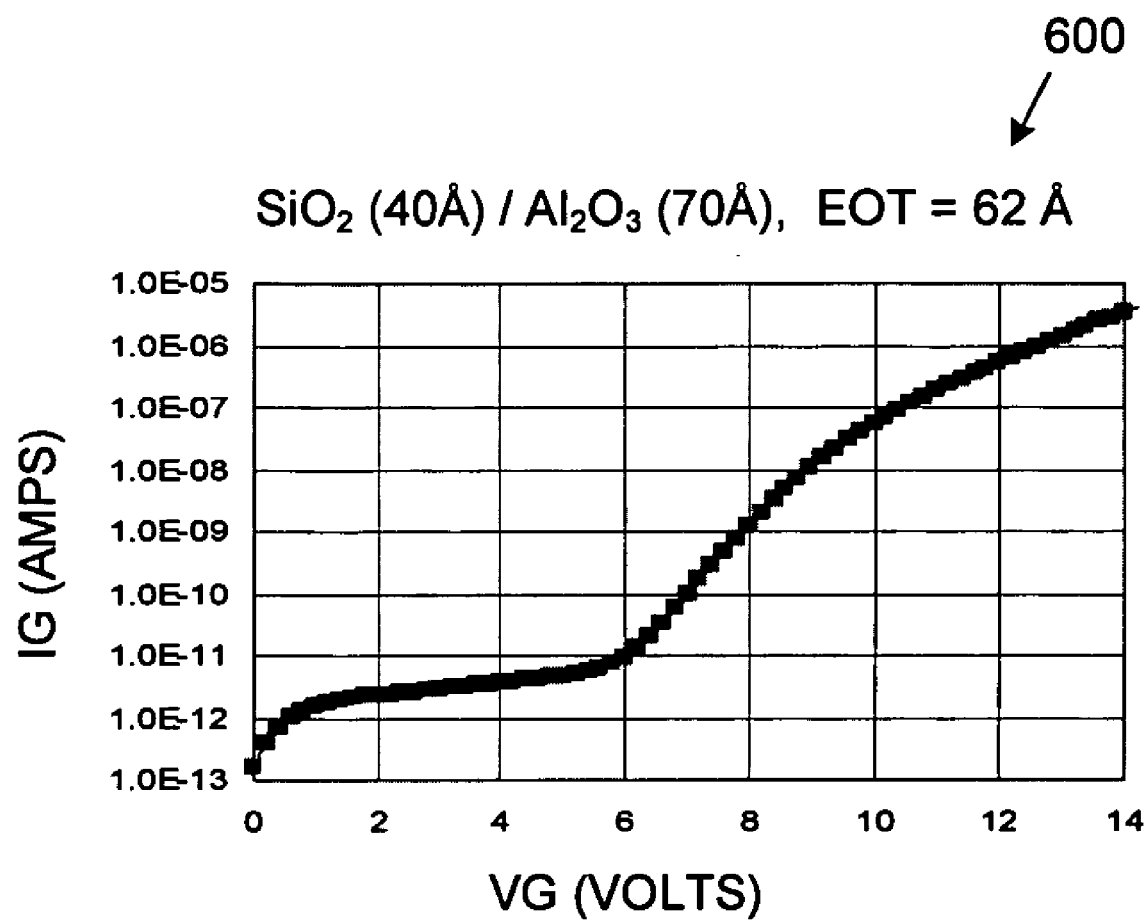
FIG. 6 is a graph that illustrates the current-voltage (I-V) characteristics of a capacitor fabricated with the dielectric structure of FIG. 5 and a composite metal electrode in accordance with one embodiment of the present invention.

FIG. 6 is a graph 600 that illustrates the current-voltage (I-V) characteristics of a capacitor structure (500×500 mm$^2$) fabricated with the alumina-silicon dioxide stack of FIG. 5 and a stacked metal upper electrode of titanium/titanium nitride (Ti/TiN) and tungsten (W).

Figure 7A:
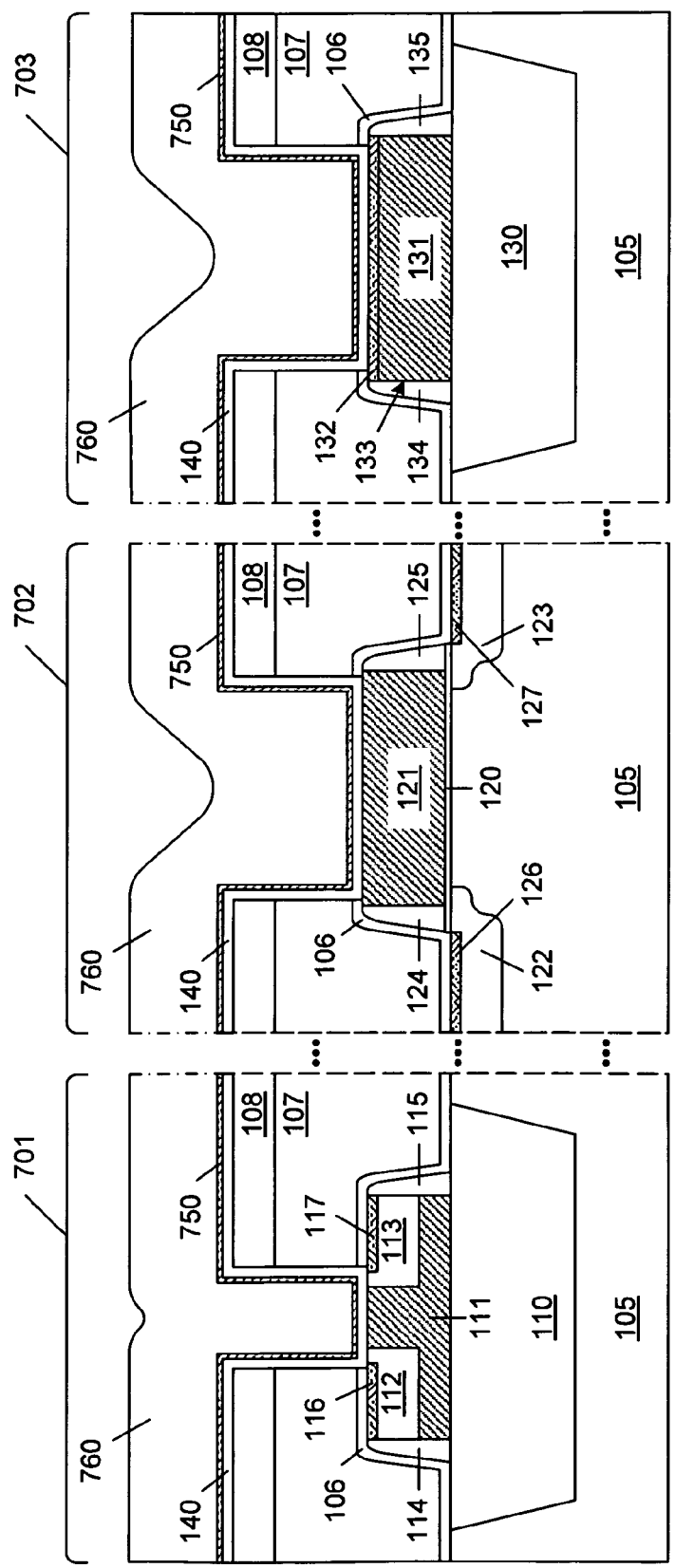
FIGS. 7A-7G are cross sectional views illustrating semiconductor devices during various stages of fabrication, in accordance with an alternate embodiment of the present invention.

FIGS. 7A-7G are cross sectional views illustrating semiconductor devices 701-703 during various stages of fabrication, in accordance with an alternate embodiment of the present invention. Semiconductor devices 701-703 are similar to semiconductor devices 101-103, with differences noted below. Processing in this alternate embodiment begins with the structure of FIG. 2D, which has been described above. At this stage of the process, the gate dielectric layer 140 has been formed in the grooves 204-206 formed in the pre-metal dielectric layer 109. A composite metal barrier layer 750, which has the same characteristics as composite metal barrier layer 150, is deposited over the gate dielectric layer 140. A metal contact layer 760, which has the same characteristics as metal contact layer 160, is deposited over the composite metal barrier layer 750. FIG. 7A is a cross-sectional diagram illustrating semiconductor devices 701-703 after composite metal barrier layer 750 and metal contact layer 760 have been deposited over the semiconductor structure of FIG. 2D. Note that the contact openings have not been formed at this time.

Figure 7B:
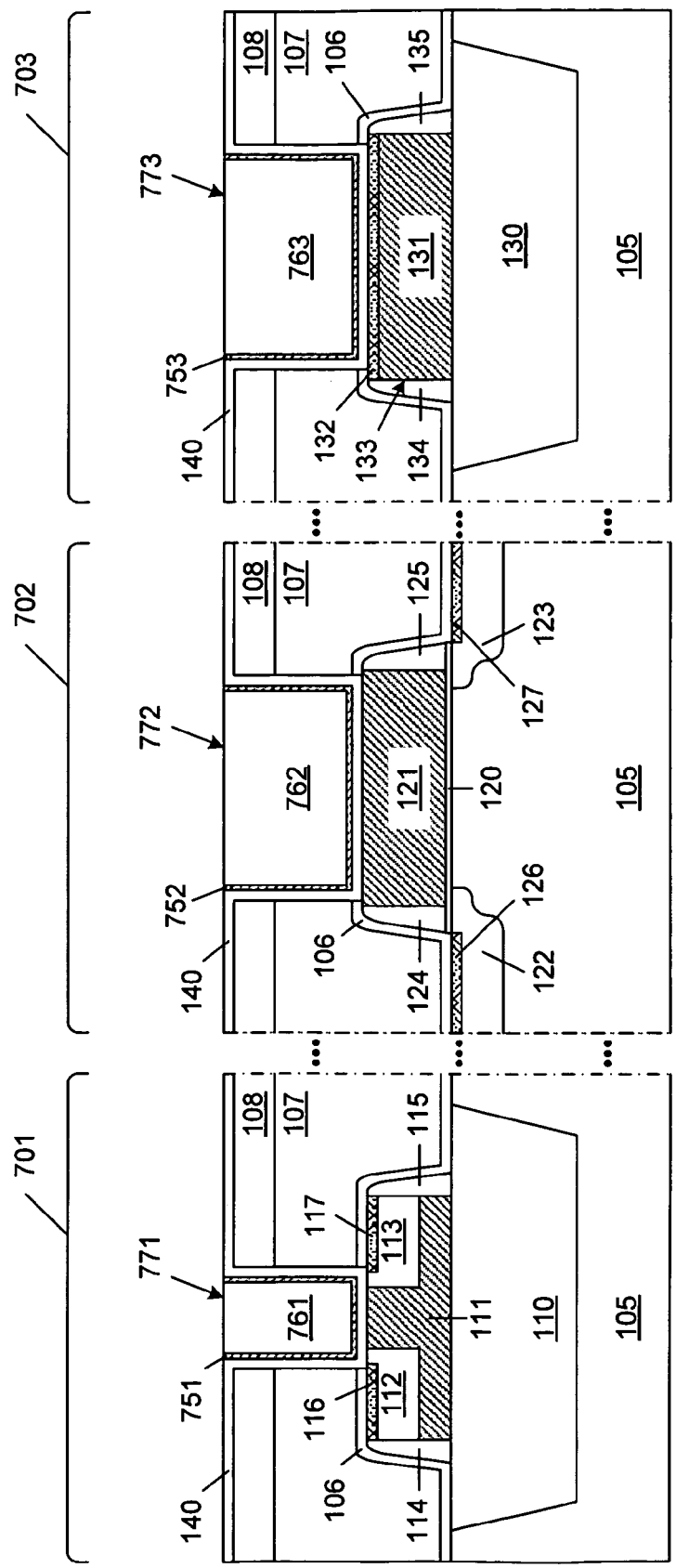

As illustrated in FIG. 7B, a chemical-mechanical polishing (CMP) process is performed, stopping on gate dielectric layer 140. It is acceptable if a portion of the upper surface of gate dielectric layer 140 is removed during this CMP process. At the end of this CMP process, composite metal barrier region 751 and metal electrode structure 761 remain to form the stacked metal gate electrode 771 of high-voltage transistor 701; composite metal barrier region 752 and metal electrode structure 762 remain to form stacked metal control gate electrode 772 of single-poly EEPROM cell 702; and composite metal barrier region 753 and metal electrode structure 763 remain to form the stacked metal upper electrode 773 of high-voltage capacitor structure 703.

Figure 7C:
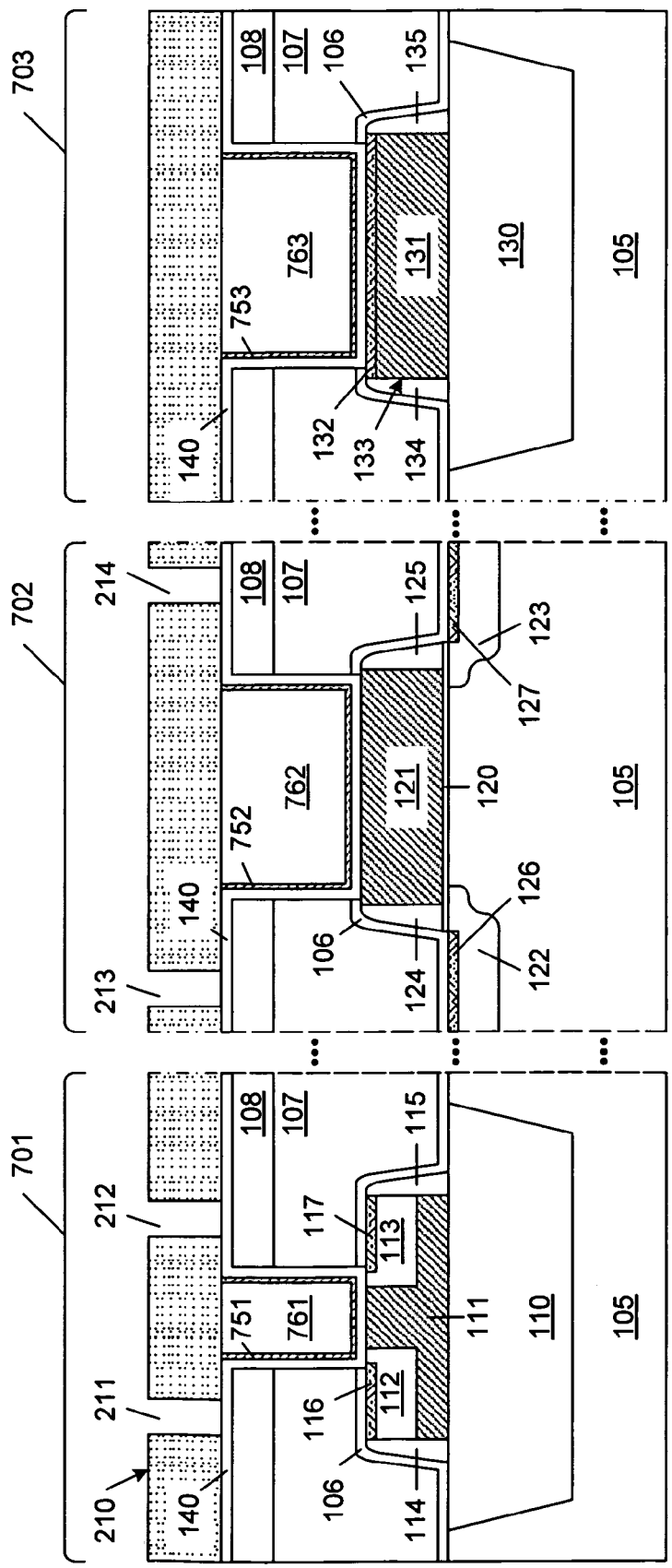

As illustrated in FIG. 7C, photoresist mask 210 is formed over the resulting structure. This photo resist mask 210, which has been described above in connection with FIG. 2E, includes openings 211, 212, 213 and 214, which define the locations where the source/drain contact plugs will be formed.

Figure 7D:
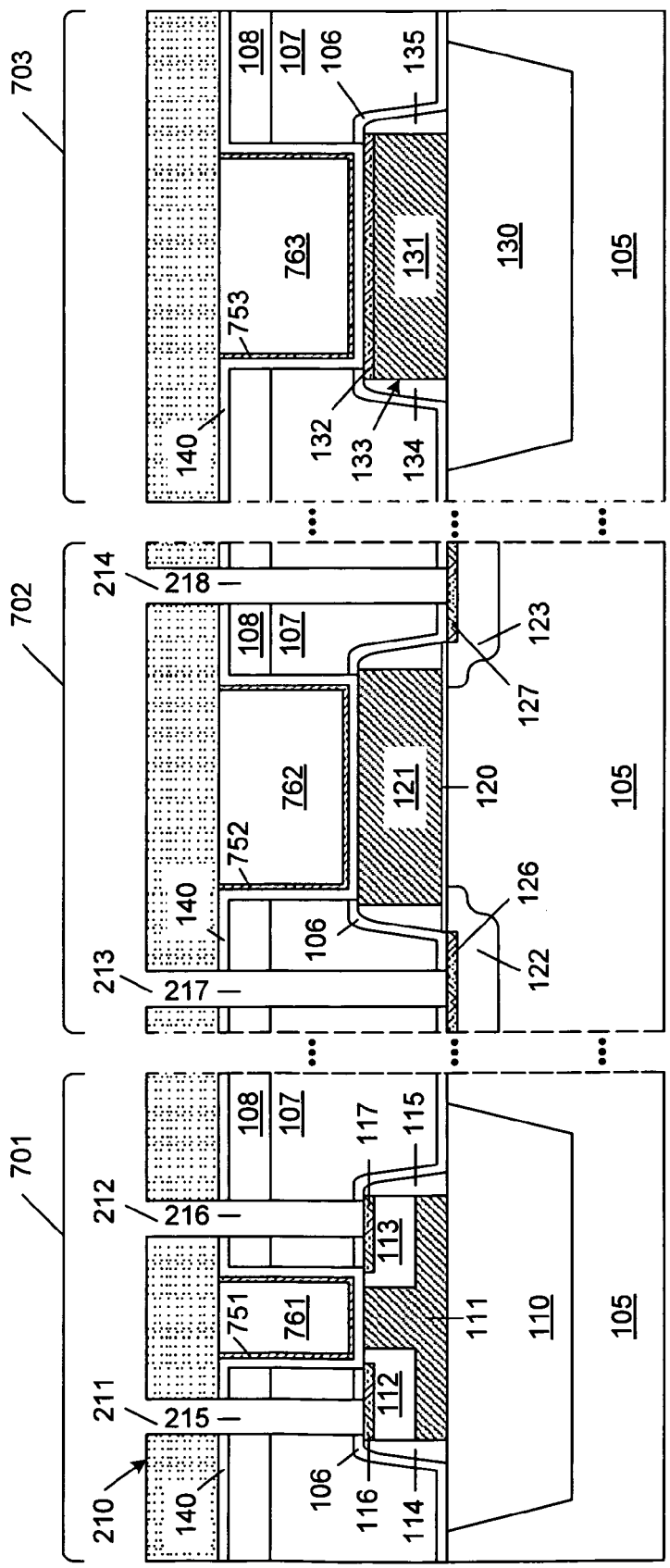

As illustrated in FIG. 7D, an etch is performed through the openings 211-214 of photo resist mask 210 thereby forming openings 215-218, respectively. The details of this etch are described above in connection with FIG. 2F.

Figure 7E:
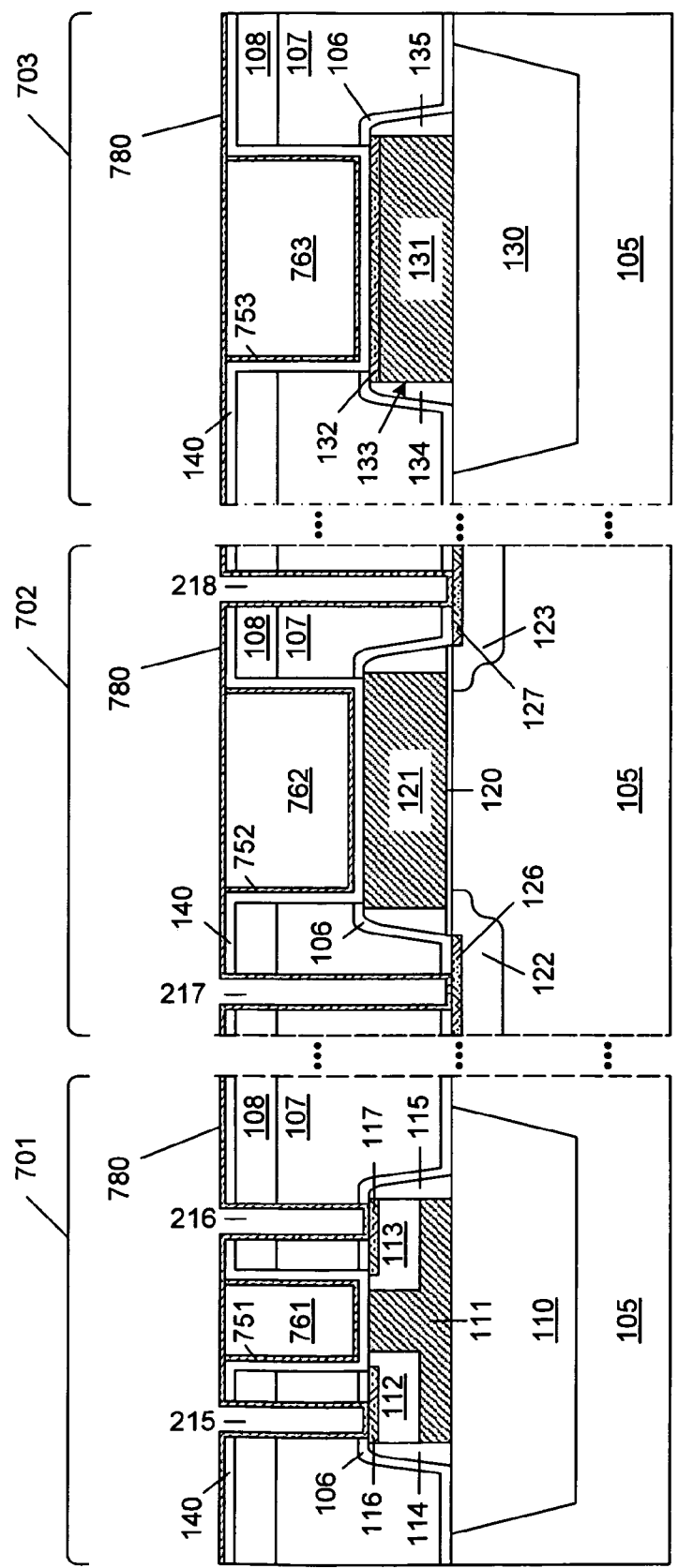

As illustrated in FIG. 7E, photoresist mask 210 is stripped, and second composite metal barrier layer 780 is formed over the resulting structure. In the described embodiment, composite metal barrier layer 780 has the same characteristics as composite metal barrier layer 750, although this is not necessary if the subsequently deposited metal contact material 790 differs from the metal of electrode (gate) structure 760.

Figure 7F:
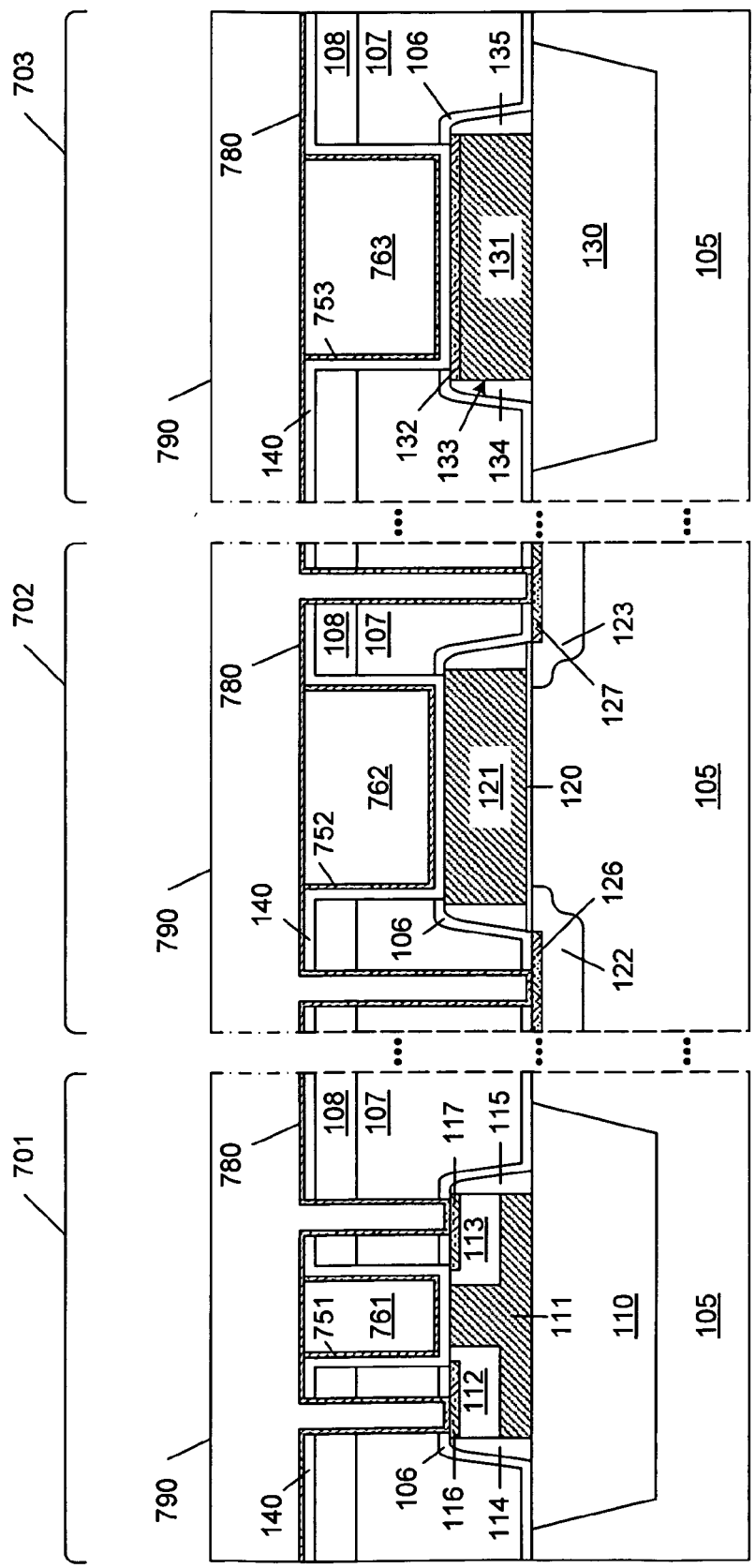
Figure 7G:
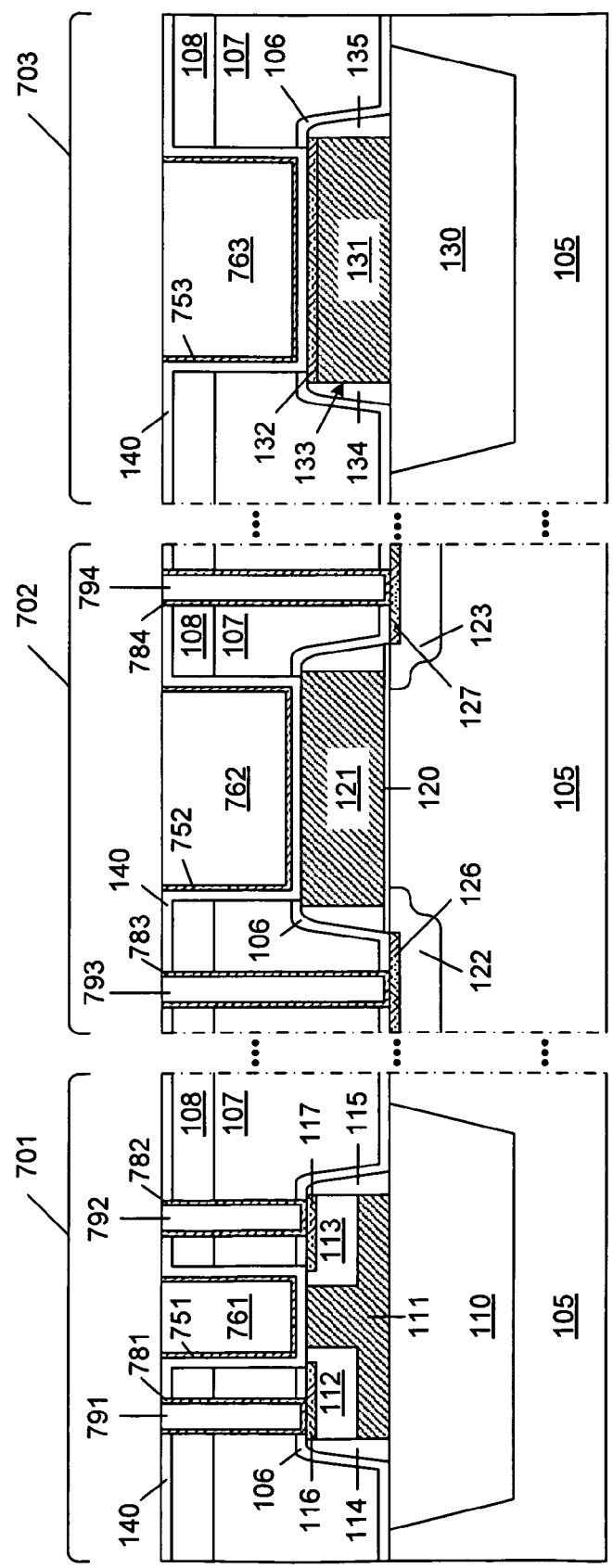

As illustrated in FIG. 7F a second layer of metal contact material 790 is formed over the second composite metal barrier layer 780. In the described embodiment, the second metal contact layer 790 has the same characteristics as the metal of electrode structure (first metal contact layer) 760, although this is not necessary. Following the deposition of the second metal contact layer 790, a chemical mechanical polishing (CMP) process is performed. This CMP process is stopped after exposing the upper surface of pre-metal dielectric layer 109. As a result, the portions of the second composite metal barrier layer 780 and the second metal contact layer 790 located directly over the upper surfaces of pre-metal dielectric structure 109 are removed. At the end of this CMP process, the remaining portions of the second composite metal barrier layer 780 form composite metal barrier regions 781-784, and the remaining portions of the second metal contact layer 790 form metal contact regions 791-794, as illustrated in FIG. 7G. From the structure illustrated in FIG. 7G, standard back-end processing steps are performed to complete fabrication of the semiconductor structure.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A method comprising:
   completing front-end processing of a semiconductor wafer, wherein the front-end processing includes formation of a pre-metal dielectric layer, but not the formation of contacts through the pre-metal dielectric layer; then
   forming a first set of grooves through the pre-metal dielectric layer;
   forming a gate dielectric layer over the pre-metal dielectric layer, wherein the gate dielectric layer extends into the first set of grooves; then
   forming a plurality of contact openings through the gate dielectric layer and the pre-metal dielectric layer; and then
   simultaneously forming stacked metal structures in the contact openings and the first set of grooves by:
      forming a barrier conductive composite layer in the contact openings and the first set of grooves, wherein the barrier conductive composite layer is formed directly on the gate dielectric layer within the first set of grooves;
      depositing a metal layer over the barrier conductive composite layer in the contact openings and the first set of grooves; and then
      performing a planarization process to remove portions of the barrier conductive composite layer and the metal layer not located in the contact openings or the first set of grooves.

2. The method of claim 1, wherein the stacked metal structures formed in the contact openings provide electrical connections to active regions of the semiconductor wafer, and wherein the stacked metal structures formed in the first set of grooves form electrodes of semiconductor devices fabricated on the semiconductor wafer.

3. The method of claim 1, wherein the barrier conductive composite layer comprises titanium and titanium nitride, and the metal layer comprises tungsten.

4. The method of claim 1, wherein the barrier conductive composite layer comprises tantalum and tantalum nitride, and the metal layer comprises aluminum or copper.

5. The method of claim 1, wherein process steps used to form the plurality of contact openings are commonly available in a conventional CMOS process.

6. The method of claim 5, wherein process steps used to form the stacked metal structures are commonly available in a conventional CMOS process.

7. The method of claim 1, wherein after the stacked metal structures are formed, the fabrication of the semiconductor wafer is completed using conventional CMOS back-end processing steps.

8. The method of claim 1, wherein the step of forming the stacked metal structures does not degrade operating parameters of semiconductor devices fabricated in the front-end processing.

9. The method of claim 1, wherein forming the first set of grooves exposes one or more doped polysilicon regions.

10. The method of claim 9, wherein at least one of the one or more doped polysilicon regions forms a body region of a transistor.

11. The method of claim 9, wherein at least one of the one or more doped polysilicon regions forms a floating gate electrode of an electrically erasable programmable read only memory (EEPROM) cell.

12. The method of claim 9, wherein at least one of the one or more doped polysilicon regions forms a lower electrode of a capacitor structure.

13. The method of claim 1, wherein forming the first set of grooves exposes an electrode structure that comprises doped polysilicon and refractive metal salicide.

14. The method of claim 13, wherein the electrode structure forms a lower electrode of a capacitor structure.

15. The method of claim 14, wherein the lower electrode is fabricated on a field isolation region located in the semiconductor wafer.

16. A method comprising:
    completing front-end processing of a semiconductor wafer, wherein the front-end processing includes formation of a pre-metal dielectric layer, but not the formation of contacts through the pre-metal dielectric layer; then
    forming a first set of grooves through the pre-metal dielectric layer, wherein forming the first set of grooves exposes an active region of the semiconductor wafer that includes doped silicon and refractive metal salicide;
    forming a gate dielectric layer over the pre-metal dielectric layer, wherein the gate dielectric layer extends into the first set of grooves; then
    forming a plurality of contact openings through the gate dielectric layer and the pre-metal dielectric layer; and then
    simultaneously forming stacked metal structures in the contact openings and the first set of grooves, wherein forming the stacked metal structures include forming a barrier conductive composite layer in the contact openings and the first set of grooves, wherein the barrier conductive composite layer is formed directly on the gate dielectric layer within the first set of grooves.

17. The method of claim 16, wherein the active region forms a lower electrode of a capacitor structure.

18. The method of claim 16, wherein the active region forms a part of a transistor structure.

19. The method of claim 1, wherein the gate dielectric layer comprises one or more silicon oxide layers and one or more silicon nitride layers.

20. The method of claim 1, wherein the gate dielectric layer is formed by depositing a high-k dielectric material.

21. The method of claim 1, wherein the gate dielectric layer is formed by stacking silicon oxide, silicon nitride and high-k dielectric layers.

* * * * *